United States Patent
Kuo et al.

(10) Patent No.: US 12,149,260 B2
(45) Date of Patent: Nov. 19, 2024

(54) METHOD AND APPARATUS FOR DECODING LOW-DENSITY PARITY-CHECK (LDPC) CODE

(71) Applicant: Silicon Motion, Inc., Zhubei (TW)

(72) Inventors: Shiuan-Hao Kuo, New Taipei (TW); Hung-Jen Huang, Taichung (TW)

(73) Assignee: SILICON MOTION, INC., Zhubei (TW)

( * ) Notice: Subject to any disclaimer, the term of this patent is extended or adjusted under 35 U.S.C. 154(b) by 88 days.

(21) Appl. No.: 18/143,343

(22) Filed: May 4, 2023

(65) Prior Publication Data

US 2023/0421175 A1 Dec. 28, 2023

(30) Foreign Application Priority Data

Jun. 23, 2022 (CN) .......................... 202210715949.4

(51) Int. Cl.
*H03M 13/11* (2006.01)
*H03M 13/37* (2006.01)
*H03M 13/00* (2006.01)

(52) U.S. Cl.
CPC .... *H03M 13/1137* (2013.01); *H03M 13/1108* (2013.01); *H03M 13/3746* (2013.01); *H03M 13/6575* (2013.01)

(58) Field of Classification Search
CPC ......... H03M 13/1137; H03M 13/1108; H03M 13/3746
See application file for complete search history.

(56) References Cited

U.S. PATENT DOCUMENTS

| | | | | |
|---|---|---|---|---|
| 10,944,428 | B2* | 3/2021 | Motwani | H03M 13/658 |
| 11,321,167 | B2* | 5/2022 | Sharon | G06F 11/1008 |
| 2018/0159560 | A1* | 6/2018 | Sharon | H03M 13/2906 |
| 2018/0175889 | A1* | 6/2018 | Bazarsky | H03M 13/6325 |
| 2022/0038114 | A1 | 2/2022 | Kim | |

FOREIGN PATENT DOCUMENTS

| | | |
|---|---|---|
| CN | 110071780 A | 7/2019 |
| TW | I717171 B | 1/2021 |

* cited by examiner

*Primary Examiner* — Joseph D Torres
(74) *Attorney, Agent, or Firm* — Birch, Stewart, Kolasch & Birch, LLP

(57) ABSTRACT

A method and apparatus for decoding a Low-Density Parity-Check (LDPC) code whereby the apparatus comprises an LDPC decoder comprising variable-node calculation circuitry and check-node calculation circuitry: the check-node calculation circuitry is arranged operably to perform a modulo 2 multiplication on a codeword and a parity check matrix to calculate a plurality of first syndromes in a first-stage state. The variable-node calculation circuitry is arranged operably to perform a bit flipping algorithm to generate variable nodes, and calculate soft bits for the variable nodes in a second-stage state. The check-node calculation circuitry is arranged to perform the modulo 2 multiplication on the variable nodes and the parity check matrix to calculate second syndromes in the second-stage. When second syndromes indicate that the previously generated variable nodes are incorrect, a third stage state is repeated until decoding succeeds or a total number of iterations exceeds a threshold.

20 Claims, 16 Drawing Sheets

METHOD AND APPARATUS FOR DECODING LOW-DENSITY PARITY-CHECK (LDPC) CODE

CROSS-REFERENCE TO RELATED APPLICATIONS

This application claims the benefit of priority to Patent Application No. 202210715949.4, filed in China on Jun. 23, 2022; the entirety of which is incorporated herein by reference for all purposes.

BACKGROUND

The disclosure generally relates to storage devices and, more particularly, to a method and an apparatus for decoding Low-Density Parity-Check (LDPC) code.

Flash memory devices typically include NOR flash devices and NAND flash devices. NOR flash devices are random access—a central processing unit (CPU) accessing a NOR flash device can provide the device any address on its address pins and immediately retrieve data stored in that address on the device's data pins. NAND flash devices, on the other hand, are not random access but serial access. It is not possible for NAND to access any random address in the way described above. Instead, the CPU has to write into the device a sequence of bytes which identifies both the type of command requested (e.g. read, write, erase, etc.) and the address to be used for that command. The address identifies a page (the smallest chunk of flash memory that can be written in a single operation) or a block (the smallest chunk of flash memory that can be erased in a single operation), and not a single byte or word. Reducing the consumption of computation resources in data reading from a flash module has always been an important issue affecting the overall performance of the flash controller. Thus, it is desirable to have a method and an apparatus for decoding LDPC code to reduce the consumption of computation resources.

SUMMARY

The disclosure relates to a method for decoding a Low-Density Parity-Check (LDPC) code, which is performed by an LDPC decoder including a variable-node calculation circuitry and a check-node calculation circuitry, to include the following steps: A first-stage state entering when a codeword has been stored in a static random access memory (SRAM) is detected. The check-node calculation circuitry is arranged operably to perform a modulo 2 multiplication on the codeword and a parity check matrix to calculate a plurality of first syndromes in the first-stage state. A second-stage state is entered when the first syndromes indicate that the codeword obtained in the first-stage state is incorrect. The variable-node calculation circuitry is arranged operably to perform a bit flipping algorithm according to the codeword, first soft bits corresponding to the codeword, and the first syndromes to generate variable nodes, and calculate second soft bits for the variable nodes in the second-stage state. The check-node calculation circuitry is arranged operably to perform the modulo 2 multiplication on the variable nodes and the parity check matrix to calculate second syndromes in the second-stage stage. A third-stage state is repeatedly entered when the second syndromes indicate that the variable nodes generated in the second-stage state are incorrect until a decoding succeeds or a total number of iterations of the third-stage state exceeds a threshold. The variable-node calculation circuitry is arranged operably to perform the bit flipping algorithm according to the variable nodes, the second soft bits corresponding to the variable nodes, and the second syndromes to generate new variable nodes, and calculate new second soft bits for the new variable nodes in each iteration of the third-stage state. The check-node calculation circuitry is arranged operably to perform the modulo 2 multiplication on the new variable nodes and the parity check matrix to calculate new second syndromes in each iteration of the third-stage stage.

The disclosure relates to an apparatus for decoding an LDPC code to include: a variable-node calculation circuitry, coupled to a SRAM; and a check-node calculation circuitry, coupled to the variable-node calculation circuitry. The apparatus enters a first-stage state when detecting a codeword has been stored in the SRAM. The check-node calculation circuitry is arranged operably to perform a modulo 2 multiplication on the codeword and a parity check matrix to calculate first syndromes in the first-stage state. The apparatus enters a second-stage state when the first syndromes indicate that the codeword obtained in the first-stage state is incorrect. The variable-node calculation circuitry is arranged operably to perform a bit flipping algorithm according to the codeword, first soft bits corresponding to the codeword, and the first syndromes to generate variable nodes, and calculate second soft bits for the variable nodes in the second-stage state. The check-node calculation circuitry is arranged operably to perform the modulo 2 multiplication on the variable nodes and the parity check matrix to calculate second syndromes in the second-stage stage. The apparatus repeatedly enters a third-stage state when the second syndromes indicate that the variable nodes generated in the second-stage state are incorrect until a decoding succeeds or a total number of iterations of the third-stage state exceeds a threshold. The variable-node calculation circuitry is arranged operably to perform the bit flipping algorithm according to the variable nodes, the second soft bits corresponding to the variable nodes, and the second syndromes to generate new variable nodes, and calculate new second soft bits for the new variable nodes in each iteration of the third-stage state. The check-node calculation circuitry is arranged operably to perform the modulo 2 multiplication on the new variable nodes and the parity check matrix to calculate new second syndromes in each iteration of the third-stage stage.

The codeword includes user data and the LDPC code. Each hard bit in the codeword is associated with at least one first soft bit to indicate a first likelihood of belief for this hard bit, and each variable node is associated with at least one second soft bit to indicate a second likelihood of belief for this variable.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent." etc.)

Figure 1:
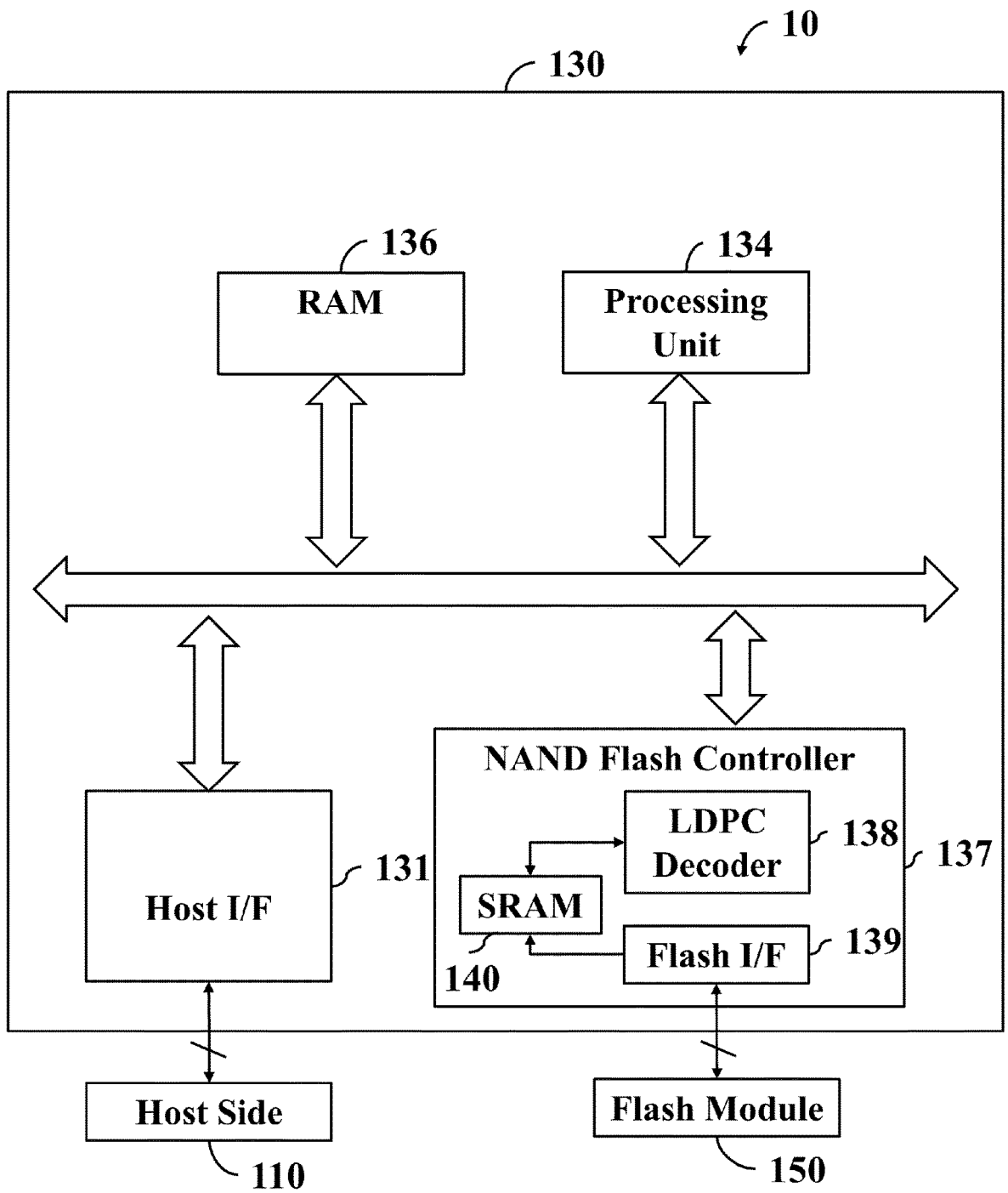
FIG. 1 is the system architecture of an electronic apparatus according to an embodiment of the invention.

Refer to FIG. 1. The electronic apparatus 10 includes the host side 110, the flash controller 130 and the flash module 150, and the flash controller 130 and the flash module 150 may be collectively referred to as a device side. The electronic apparatus 10 may be practiced in a Personal Computer (PC), a laptop PC, a tablet PC, a mobile phone, a digital camera, a digital recorder, smart television, smart refrigerator, or other consumer electronic products. The host side 110 and the host interface (I/F) 131 of the flash controller 130 may communicate with each other by Universal Serial Bus (USB), Advanced Technology Attachment (ATA), Serial Advanced Technology Attachment (SATA), Peripheral Component Interconnect Express (PCI-E), Universal Flash Storage (UFS), Embedded Multi-Media Card (eMMC) protocol, or others. The NAND flash controller (NFC) 137 of the flash I/F 139 and the flash module 150 may communicate with each other by a Double Data Rate (DDR) protocol, such as Open NAND Flash Interface (ONFI), DDR Toggle, or others. The flash controller 130 includes the processing unit 134 and the processing unit 134 may be implemented in numerous ways, such as with general-purpose hardware (e.g., a microcontroller unit, a single processor, multiple processors or graphics processing units capable of parallel computations, or others) that is programmed using firmware and/or software instructions to perform the functions recited herein. The processing unit 134 receives host commands, such as host read, write, discard, trim, erase commands, through the host I/F 131, schedules and executes these commands. The flash controller 130 includes the Random Access Memory (RAM) 136 and the RAM 136 may be implemented in a Dynamic Random Access Memory (DRAM), a Static Random Access Memory (SRAM), or the combination thereof, for allocating space as a data buffer storing user data (also referred to as host data) that is to be programmed into the flash module 150, and has been read from the flash module 150 and is to be output to the host side 110. The RAM 136 stores necessary data in execution, such as variables, data tables, data abstracts, host-to-flash (H2F) tables, flash-to-host (F2H) tables, and so on. The NFC 137 provides functions that are required to access to the flash module 150, such as a command sequencer, a Low-Density Parity-Check (LDPC) encoder/decoder, etc.

A bus architecture may be configured in the flash controller 130 for coupling between components to transfer data, addresses, control signals, etc., which include the host I/F 131, the processing unit 134, the RAM 136, the NFC 137, and so on. The bus includes a set of parallel physical-wires connected to two or more components of the flash controller 130. The bus is a shared transmission medium so that only two devices can access to the wires to communicate with each other for transmitting data at any one time. Data and control signals travel in both directions between the components along data and control lines, respectively. Addresses on the other hand travel only one way along address lines. For example, when the processing unit 134 wishes to read data from a particular address of the RAM 136, the processing unit 134 sends this address to the RAM 136 on the address lines. The data of that address is then returned to the processing unit 134 on the data lines. To complete the data read operation, control signals are sent along the control lines.

The flash module 150 provides huge storage space typically in hundred Gigabytes (GB), or even several Terabytes (TB), for storing a wide range of user data, such as high-resolution images, video files, etc. The flash module 150 includes control circuits and memory arrays containing memory cells that can be configured as Single Level Cells (SLCs), Multi-Level Cells (MLCs), Triple Level Cells (TLCs), Quad-Level Cells (QLCs), or any combinations thereof. The processing unit 134 programs user data into a designated address (a destination address) of the flash module 150 and reads user data from a designated address (a source address) thereof through the flash I/F 139. The flash I/F 139 may use several electronic signals run on physical wires including data lines, a clock signal line and control signal lines for coordinating the command, address and data transfer with the flash module 150. The data lines may be used to transfer commands, addresses, read data and data to be programmed; and the control signal lines may be used to transfer control signals, such as Chip Enable (CE), Address Latch Enable (ALE), Command Latch Enable (CLE), Write Enable (WE), etc.

Figure 2:
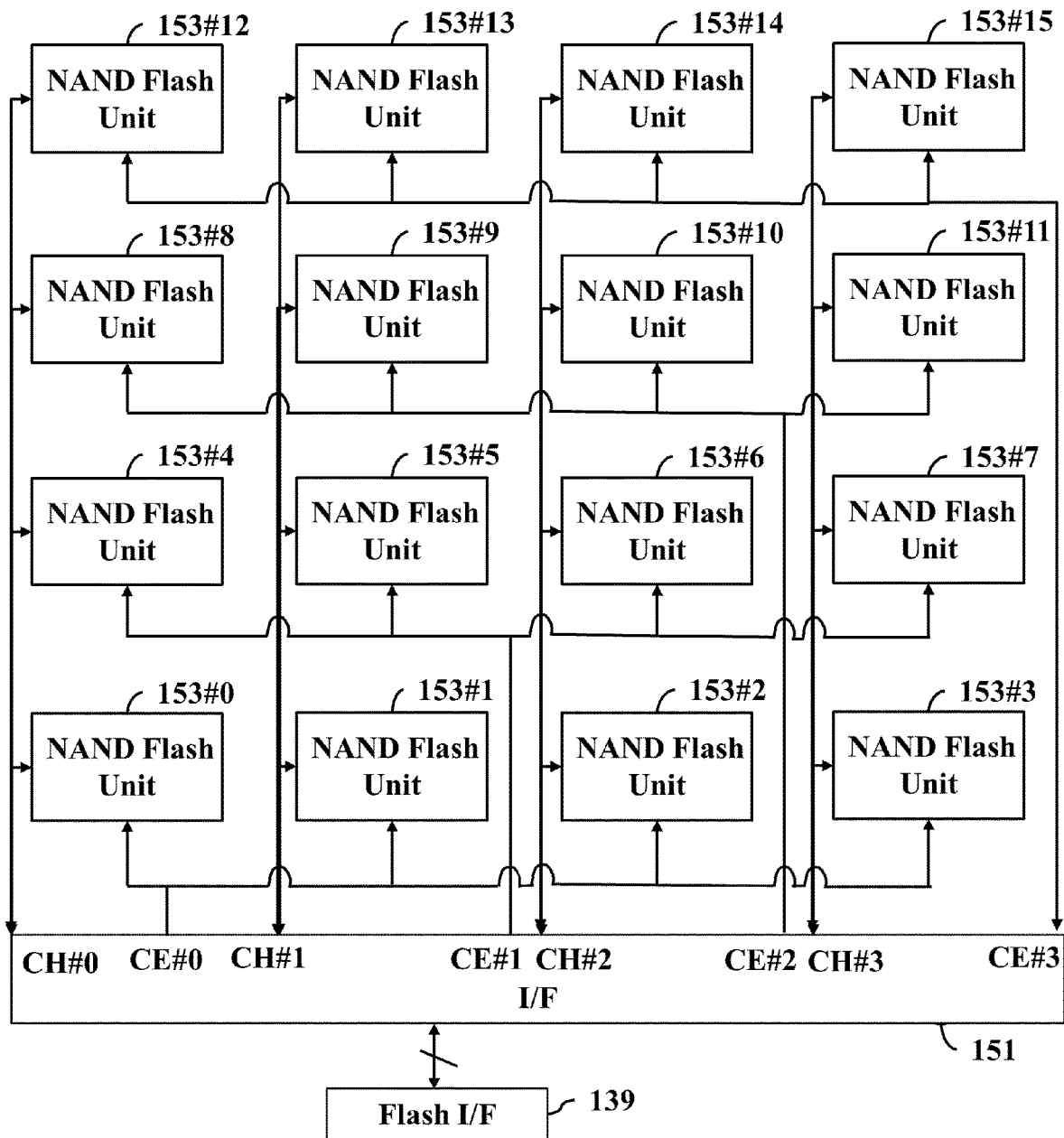
FIG. 2 is a schematic diagram illustrating a flash module according to an embodiment of the invention.

Refer to FIG. 2. The flash I/F 151 may include four I/O channels (hereinafter referred to as channels) CH #0 to CH #3 and each is connected to four NAND flash units, for example, the channel CH #0 is connected to the NAND flash units 153 #0, 153 #4, 153 #8 and 153 #12. Each NAND flash unit can be packaged in an independent die. The flash I/F 139 may issue one of the CE signals CE #0 to CE #3 through the I/F 151 to activate the NAND flash units 153 #0 to 153 #3, the NAND flash units 153 #4 to 153 #7, the NAND flash units 153 #8 to 153 #11, or the NAND flash units 153 #12 to 153 #15, and read data from or program data into the activated NAND flash units in parallel. Those artisans may modify the design of the flash modules 150 to include more or less channels, and/or make each channel connect more or less NAND flash units according to different system requirements, and the invention should not be limited thereto.

The NFC 137 may include an LDPC encoder capable of generating an LDPC code according to user data, which is a linear error correcting code. For example, the generation of LDPC code can be expressed with the following formula:

$$MSG_{1 \times n} \odot PCM_{n \times (n+m)} = CW_{1 \times (n+m)}$$

where $MSG_{1 \times n}$ represents a 1-row, n-column matrix of user data, $PCM_{n \times (n+m)}$ represents a n-row, (n+m)-column of parity check matrix, $CW_{1 \times (n+m)}$ represents a 1-row, (n+m)-column matrix of final codeword, and $\odot$ represents the modulo 2 multiplication. The parity check matrix may include a Quasi-Cyclic (QC) structure. The value of the first n bits in $CW_{1 \times (n+m)}$ is equal to the value of $MSG_{1 \times n}$ and the value of the last m bits in $CW_{1 \times (n+m)}$ is referred to as LDPC code. An example is as follows:

$$(1\ 0\ 1) \odot \begin{pmatrix} 1 & 0 & 0 & 1 & 0 & 1 \\ 0 & 1 & 0 & 1 & 1 & 1 \\ 0 & 0 & 1 & 1 & 1 & 0 \end{pmatrix} = (1\ 0\ 1\ 0\ 1\ 1)$$

Those artisans know that a well-known efficient algorithm (such as 2-stage encoding, etc.) with a corresponding parity check matrix can be used to generate the LDPC code.

Figure 3:
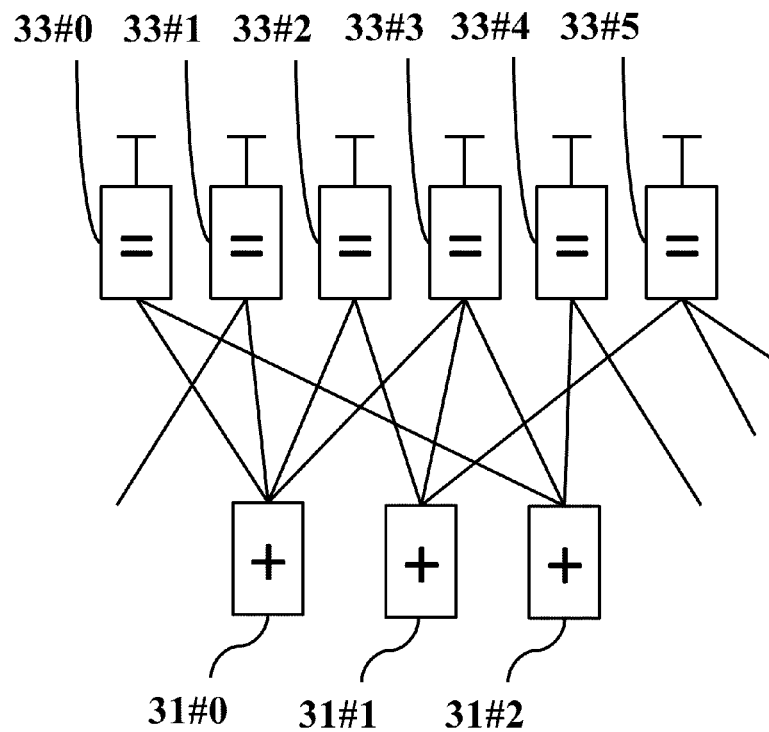
FIG. 3 is a schematic diagram illustrating an exemplary Low-Density Parity-Check (LDPC) code according to an embodiment of the invention.

The NFC 137 includes the LDPC decoder 138 capable of reading codewords (each including user data and an LDPC code) from the flash module 150 through the flash I/F 139 and determining whether each codeword includes any error bit. Once discovering any error bit in any codeword, the LDPC decoder 138 attempts to recover a correct codeword and obtain the user data from the correct one. If the correct codeword cannot be recovered after a predetermined number of attempts, the LDPC decoder 138 determines that the codeword is an uncorrectable codeword. For LDPC decoding, refer to FIG. 3 showing an exemplary (n=3, k=6) LDPC code. Blocks 33 #0 to 33 #5 represent variable nodes and blocks 31 #0 to 31 #2 represent check nodes. Bit values of the variable nodes 33 #0 to 33 #5 form a codeword composed of user data and an LDPC code, and the bit values of the codeword satisfy the graphical constraints. Specifically, all lines connecting to a variable node have the same value, and all values connecting to a check node must sum, modulo two, to zero (that is, they must sum to an even number; or there must be an even number of odd values). The check nodes 31 #0 to 31 #2 may also be called syndromes.

The NFC 137 includes the static random access memory (SRAM) 140 for storing necessary data in decoding. The flash I/F 139 may store codewords (also referred to as hard bits) and soft bits read from the flash module 150 in designated addresses in the SRAM 140. Each hard bit corresponds to at least one soft bit to indicate the likelihood of belief for this hard bit. To correct error bits in each codeword, the SRAM 140 needs to allocate space to store updated variable nodes and the related soft bits during the decoding. Similarly, each variable node corresponds to at least one soft bit to indicate the likelihood of belief for this variable node. However, the SRAM 140 is a scarce resource that requires proper planning and use to improve its utilization.

The LDPC decoder 138 includes two important circuitries: a check-node calculation circuitry and a variable-node calculation circuitry. The check-node calculation circuitry performs the modulo 2 multiplication on each codeword or variable node and the parity check matrix to calculate syndromes. The variable-node calculation circuitry executes a well-known bit flipping algorithm to generate new variable nodes according to the bits corresponding to each codeword or variable node and uses a well-known formula to calculate soft bits of the new variable nodes. However, the operations of the check-node calculation circuitry and the variable-node calculation circuitry are interdependent, in which the results produced by one circuitry will be the input of the other circuitry. Therefore, a general mechanism is required to coordinate with the operations of the check-node calculation circuitry and the variable-node calculation circuitry.

To coordinate with the operations of the check-node calculation circuitry and the variable-node calculation circuitry, an embodiment of the invention introduces a three-stage of LDPC decoding. Although the specification describes the technical problems to be addressed, this is only used to illustrate the inspiration of embodiments of the present invention as follows. Those artisans can apply the technical solutions to solve other technical problems or be applicable to other technical environments, and the invention should not be limited thereto. The LDPC decoder 138 enters one of the three stages according to a current execution condition, so that the check-node calculation circuitry and the variable-node calculation circuitry therein can complete the required operations corresponding to the entered stage. Specifically, when detecting that any codeword has been stored in the SRAM 140, the LDPC decoder 138 enters a first-stage state. In the first-stage state, the check-node calculation circuitry performs the modulo 2 multiplication on the codeword and the predefined parity check matrix to calculate first syndromes, where the codeword includes bits of user data and a LDPC code. When the first syndromes indicate that the codeword obtained in the first-stage state is incorrect, the LDPC decoder 138 enters a second-stage state. In the second-stage state, the variable-node calculation circuitry executes the bit flipping algorithm according to the codeword, and first soft bits and the first syndromes corresponding to the codeword to generate variable nodes and calculates second soft bits corresponding to the variable nodes using the preset formula. The check-node calculation circuitry performs the modulo 2 multiplication on the variable nodes and the parity check matrix to calculate second syndromes. Each hard bit in the codeword is associated with at least one first soft bit to indicate the likelihood of belief for this hard bit. Each variable node is associated with at least one second soft bit to indicate the likelihood of belief for this variable node. When the second syndromes indicate that the variable nodes generated in the second-stage state is incorrect, the LDPC decoder 138 repeatedly enters a third-stage state until the decoding succeeds or the total number of iterations of the third-stage state exceeds a predefined threshold. In each iteration of the second-stage state, the variable-node calculation circuitry executes the bit flipping algorithm according to the variable nodes, and the second soft bits and the second syndromes corresponding to the variable nodes to generate new variable nodes and calculates new second soft bits corresponding to the new variable nodes using the preset formula. The check-node calculation circuitry performs the modulo 2 multiplication on the new variable nodes and the parity check matrix to calculate new second syndromes.

In some embodiments, the LDPC decoder 138 includes a finite-state machine (FSM), which is used to direct the LDPC decoder 138 to enter the first-stage state when the codeword has been stored in the SRAM 140; direct the LDPC decoder 138 to enter the second-stage state in response to the first syndromes indicate that the codeword obtained in the first-stage state is incorrect; direct the LDPC decoder 138 to enter the third-stage state in response to the second syndromes indicate that the variable nodes generated in the second-stage state or the previous third-stage state are incorrect; and limit the number of iterations to enter the third-stage state not to exceed the threshold.

Figure 4:
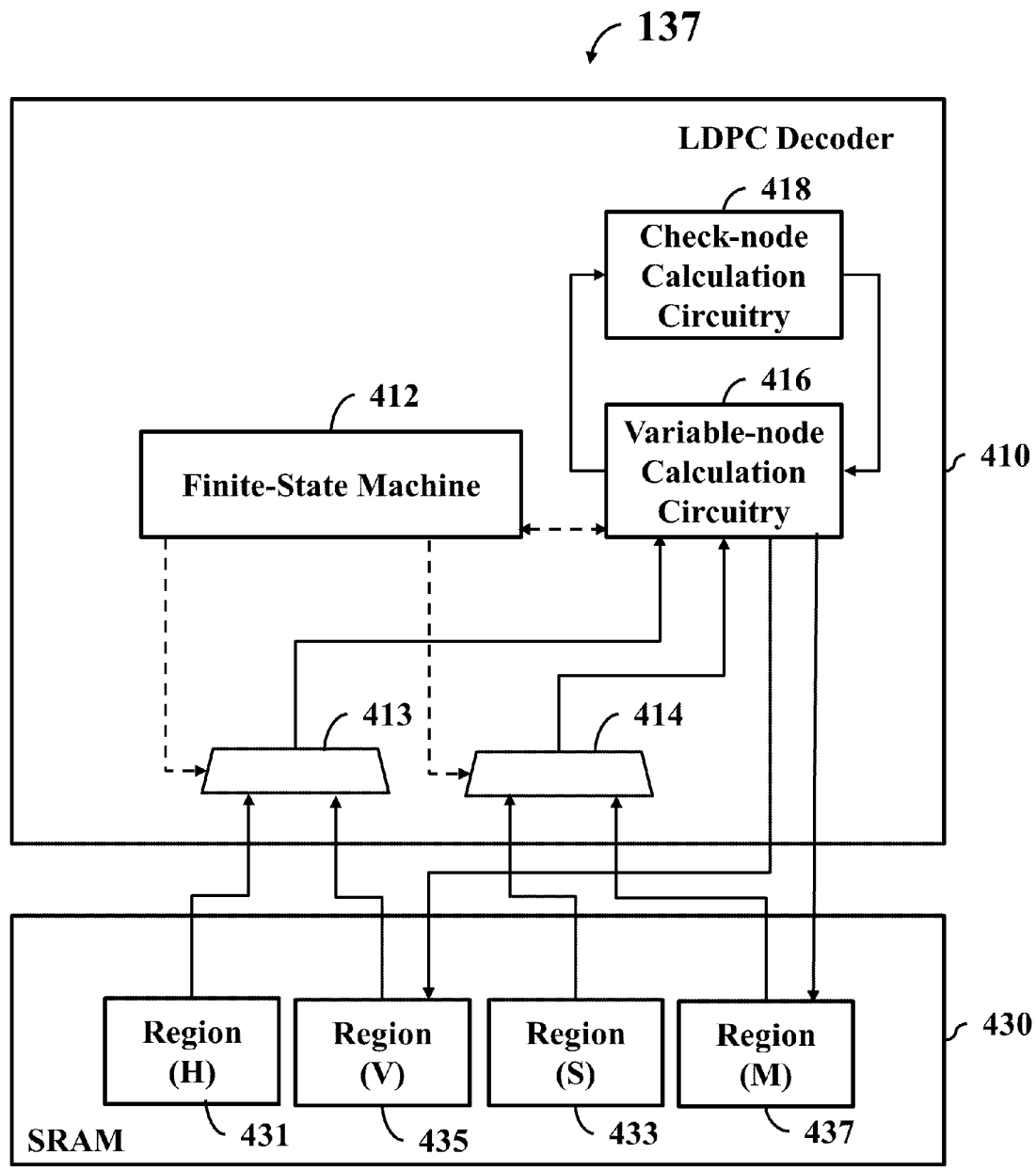
FIG. 4 is a block diagram showing a NAND flash controller (NFC) according to an embodiment of the invention.

In some embodiments, the flash I/F 139 includes a soft-bit calculation circuitry capable of calculating soft bits for each hard bit in a codeword when the codeword is read from the flash module 150. In view of this arrangement, refer to FIG. 4 illustrating the block diagram of the NFC 137. Four regions 431, 433, 435 and 437 are allocated in the SRAM 430 for storing the hard bits, the soft bits corresponding to the hard bits, variable nodes, and the soft bits corresponding to the variable node, respectively. The flash I/F 139 writes the hard bits read from the flash module 150 into the region 431 and writes the calculated soft bits into the region 433. The LDPC decoder 410 includes the FSM 412, the multiplexers 413 and 414, the variable-node calculation circuitry 416 and the check-node calculation circuitry 418. The check-node calculation circuitry 418 calculates the syndromes according to the hard bits stored in the region 431 or the variable nodes stored in the region 435, and the parity check matrix. The generation of syndromes can be expressed with the following formula:

$$PCM_{n \times (n+m)} \odot CW_{(n+m) \times 1} = SYD_{m \times 1}$$

where $PCM_{n \times (n+m)}$ represents a n-row, (n+m)-column of parity check matrix, $CW_{(n+m) \times 1}$ represents a (n+m)-row, 1-column matrix of codeword, $SYD_{m \times 1}$ represents a m-row, 1-column of syndromes, and $\odot$ represents the modulo 2 multiplication. An example is as follows:

$$\begin{pmatrix} 1 & 1 & 1 & 1 & 0 & 0 \\ 0 & 0 & 1 & 1 & 0 & 1 \\ 1 & 0 & 0 & 1 & 1 & 0 \end{pmatrix} \odot \begin{pmatrix} 1 \\ 0 \\ 1 \\ 0 \\ 1 \\ 1 \end{pmatrix} = \begin{pmatrix} 0 \\ 0 \\ 0 \end{pmatrix}$$

Since the calculated syndromes are all "0", the codeword does not contain error bits. If the calculated syndromes are not all "0", the codeword contains error bits. The check-node calculation circuitry 418 outputs the hard bits or the variable nodes, and the calculated syndromes to the variable-node calculation circuitry 416. In some embodiments, the check-node calculation circuitry 418 may calculate the reliabilities of syndromes according to the soft bits corresponding to the hard bits or the variable nodes and transmit the syndromes together with their reliabilities to the variable-node calculation circuitry 416.

The variable-node calculation circuitry 416 determines whether the codeword received from the check-node calculation circuitry 418 needs to be corrected. If not needed (that is, the syndromes are all "0"), the variable-node calculation circuitry 418 sends a successful decoding message to the FSM 412. If needed (that is, the syndromes are not all "0"), the variable-node calculation circuitry 418 sends a message of decoding failure to the FSM 412 and performs a well-known bit flipping algorithm to change the state(s) of one or more hard bits in the codeword, or variable nodes that could be wrong (that is, change "0b0" to "0b1", or change "0b1" to "0b0" for any suspicious bit) according to the syndromes, hard bits or variable nodes, and soft bits corresponding to the hard bits or the variable nodes. The variable-node calculation circuitry 416 stores the updated variable nodes in the region 435 in the SRAM 430. The variable-node calculation circuitry 416 uses one or more well-known formulae to calculate soft bits corresponding to the updated variable nodes accordingly and stores the calculated soft bits in the region 437 in the SRAM 430. The soft bits may be Log-Likelihood Ratio (LLR), Quantization of LLR, or others.

Figure 5:
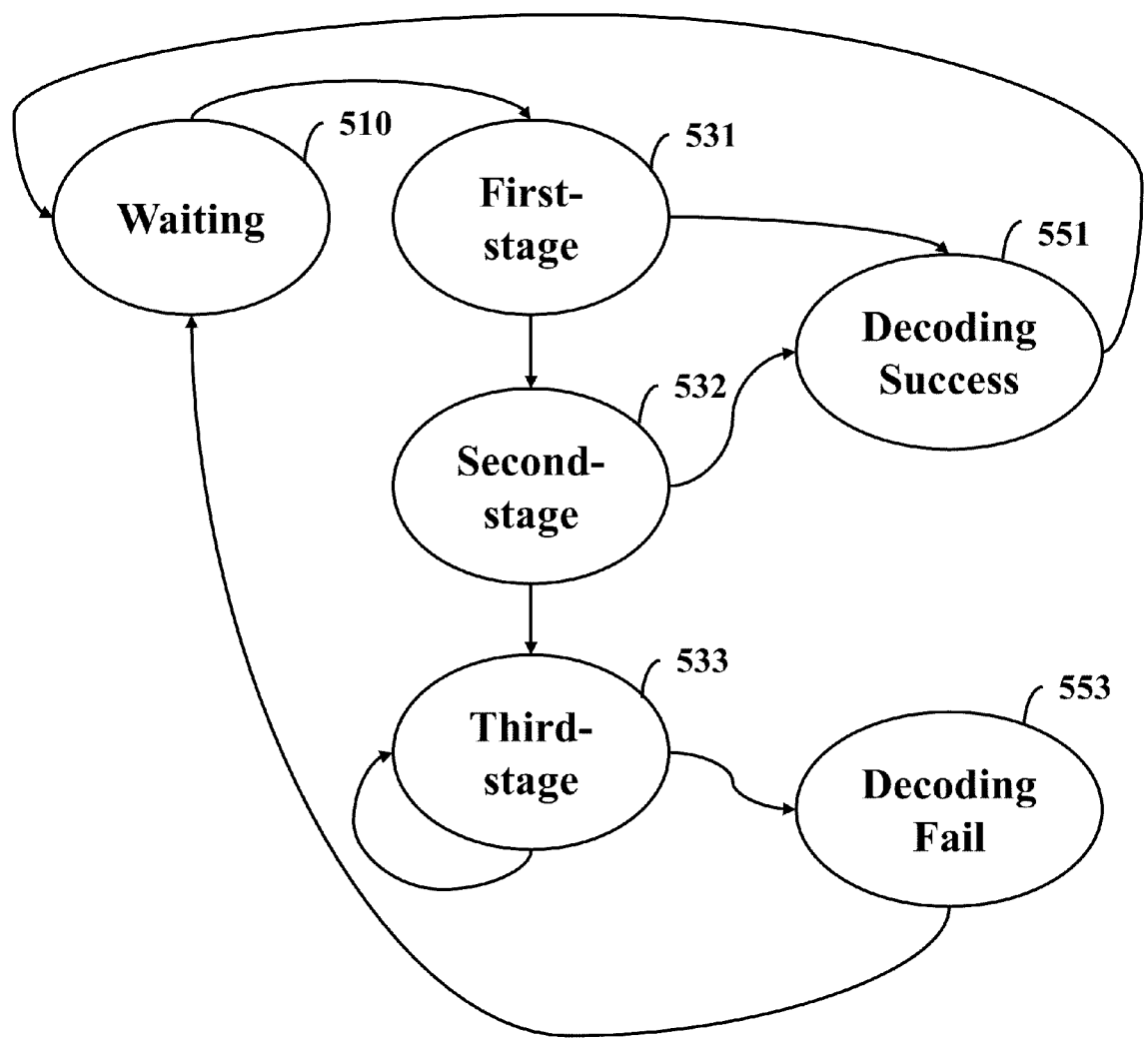
FIG. 5 is a schematic diagram showing exemplary state transitions in a finite-state machine (FSM) according to an embodiment of the invention.

The FSM 412 employs three stages to handle the whole process of LDPC decoding. In each stage, the FSM 412 outputs proper control signals to the MUX 413 and 414 and the variable-node calculation circuitry 416 for driving these components to complete the LDPC decoding together. FIG. 5 shows exemplary state transitions in the FSM 412. The output terminal of the MUX 413 is coupled to the variable-node calculation circuitry 416 and two input terminals of the MUX 413 are coupled to the regions 431 and 435 in the SRAM 430, respectively. The output terminal of the MUX 414 is coupled to the variable-node calculation circuitry 416 and two input terminals of the MUX 414 are coupled to the regions 433 and 437 in the SRAM 430, respectively.

Figure 6:
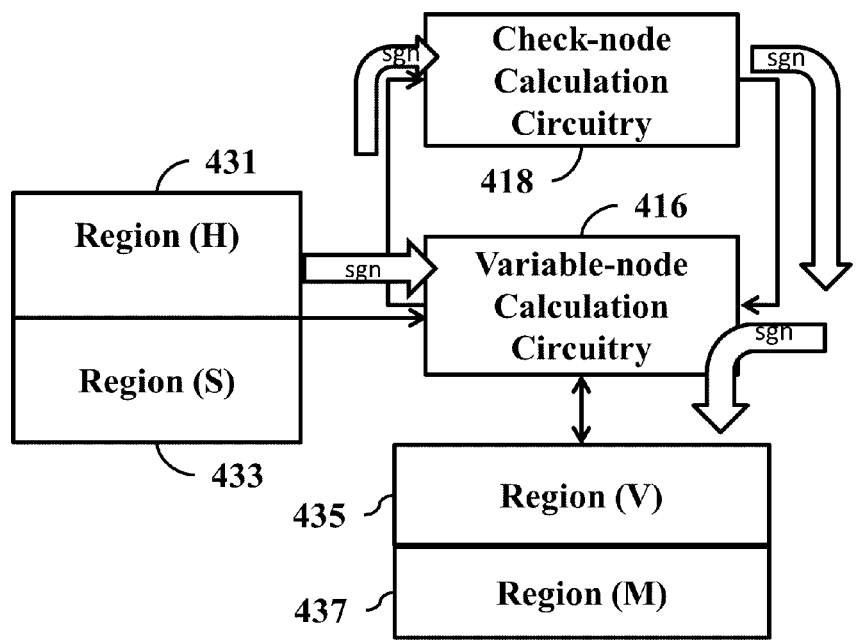
FIG. 6 is a schematic diagram showing a data flow in the first stage, which corresponds to the hardware architecture in FIG. 4, according to an embodiment of the invention.

The FSM 412 enters the first-stage state 531 from the waiting state 510 after the flash I/F 139 stores hard bits and soft bits in the regions 431 and 433, respectively. The first stage may be referred to as a hard-bit initialization stage. In the first stage, the FSM 412 issues a control signal to the MUX 413 for coupling the region 431 to the variable-node calculation circuitry 416, and then, drives the variable-node calculation circuitry 416 to perform the operations for the first stage. Refer to FIG. 6 illustrating a schematic diagram of the data flow in the first stage. The variable-node calculation circuitry 416 reads the hard bits (denoted as "sgn") from the region 431 through the MUX 413 and transmits the hard bits to the check-node calculation circuitry 418. The check-node calculation circuitry 418 calculates syndromes according to the obtained hard bits and the predefined parity check matrix and transmits the hard bis and the syndromes to the variable-node calculation circuitry 416. When the syndromes are all "0", the variable-node calculation circuitry 416 sends a decoding success message to the FSM 412, thereby enabling the FSM 412 to enter the decoding success state 551. When the syndromes are not all "0", the variable-node calculation circuitry 416 sends a decoding fail message to the FSM 412, thereby enabling the FSM 412 to enter the second-stage state 532. Since the hard bits has been stored in the region 435, the region 431 is no longer to be used for the current codeword in process. The region 431 is released to store the next codeword read from the flash module 150, so that the decoding of this codeword and the next codeword can be performed in parallel to improve the efficiency of data read.

Figure 7:
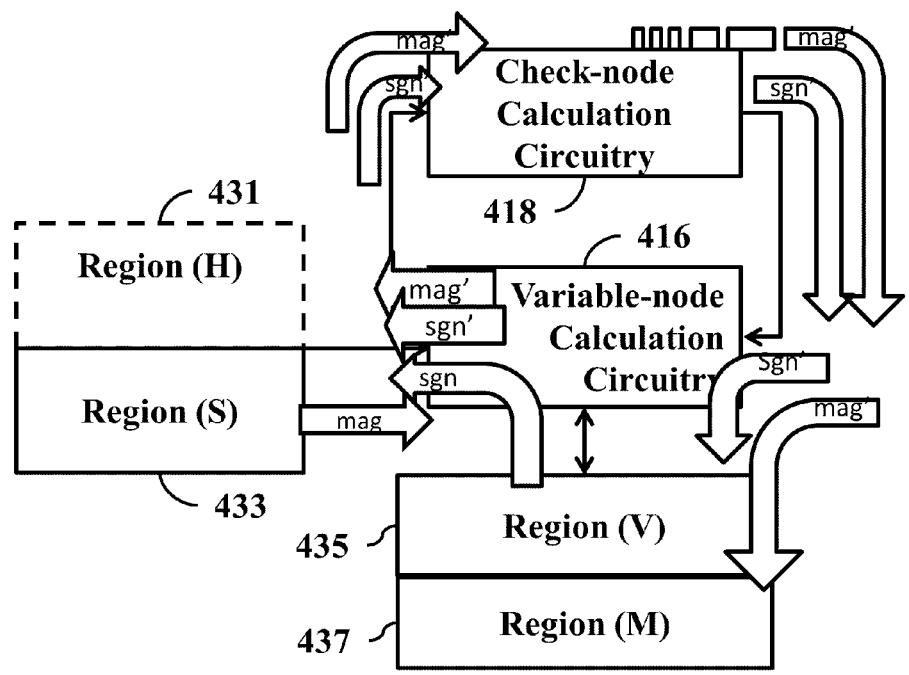
FIG. 7 is a schematic diagram showing a data flow in the second stage, which corresponds to the hardware architecture in FIG. 4, according to an embodiment of the invention.

The second stage may be referred to as a soft-bit initialization and decoding stage including the first iteration of decoding. In the second stage, the FSM 412 issues a control signal to the MUX 413 for coupling the region 433 to the variable-node calculation circuitry 416, and then, drives the variable-node calculation circuitry 416 to perform the operations for the second stage. Refer to FIG. 7 illustrating a schematic diagram of the data flow in the second stage. The variable-node calculation circuitry 416 reads the hard bits (denoted as "sgn") from the region 435 through the MUX 413, reads the soft bits (denoted as "mag") from the region 433 through the MUX 414, performs a well-known bit flipping algorithm according to the syndromes calculated in the first stage, the hard bits sgn and the soft bits mag to replace the hard bits sgn with variable nodes sgn' and uses one or more well-known formulae to calculate soft bits mag' according to the updated variable nodes sgn'. Subsequently, the variable-node calculation circuitry 416 transmits the variable nodes sgn' and the corresponding soft bits mag' to the check-node calculation circuitry 418. The check-node calculation circuitry 418 calculates syndromes according to the obtained variable nodes sgn' and the predefined parity check matrix and transmits the variable nodes sgn', the corresponding soft bits mag' and the syndromes to the variable-node calculation circuitry 416. When the syndromes are all "0", the variable-node calculation circuitry 416 sends a decoding success message to the FSM 412, thereby enabling the FSM 412 to enter the decoding success state 551. When the syndromes are not all "0", the variable-node calculation circuitry 416 sends a decoding fail message to the FSM 412, thereby enabling the FSM 412 to enter the third-stage state 533. Since the initial soft bits has been stored in the region 437, the region 433 is no longer to be used for the current codeword in process. The region 433 is released to store soft bits for the next codeword by the flash I/F 139, so that the decoding of this codeword and the next codeword can be performed in parallel to improve the efficiency of data read.

Figure 8:
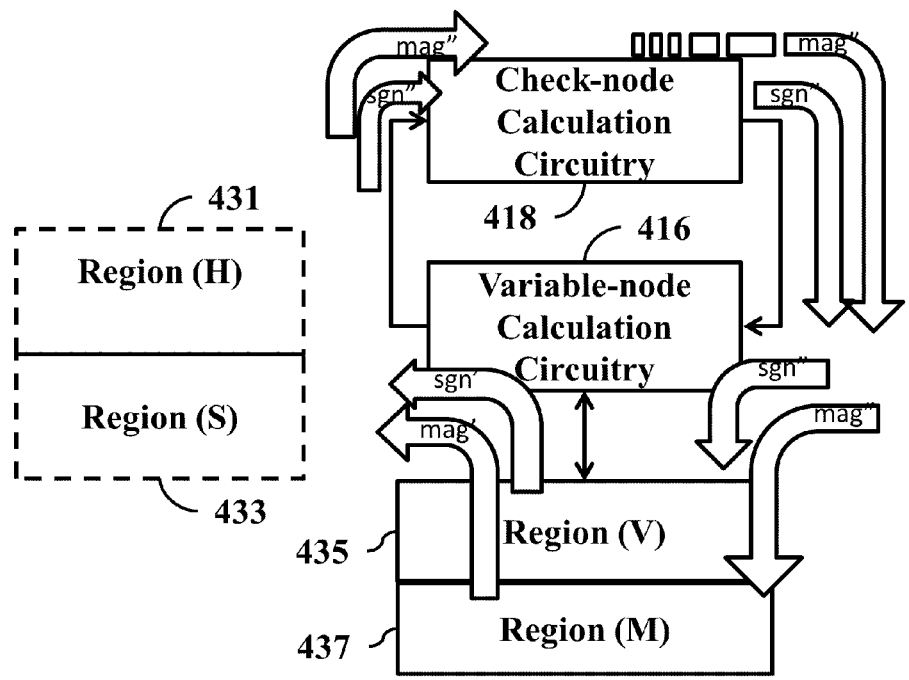
FIG. 8 is a schematic diagram showing a data flow in the third stage, which corresponds to the hardware architecture in FIG. 4, according to an embodiment of the invention.

The third stage may include the second and subsequent decoding iterations. This stage is repeatedly entered until the decoding is successful, or the decoding fails after the preset number of iterations. At the beginning of entering the third stage, the FSM 412 issues a control signal to the MUX 414 for coupling the region 437 to the variable-node calculation circuitry 416, and then, drives the variable-node calculation circuitry 416 to perform the operations for the third stage. Refer to FIG. 8 illustrating a schematic diagram of the data flow in the third stage. The variable-node calculation circuitry 416 reads the variable nodes (denoted as "sgn") from the region 435 through the MUX 413, reads the corresponding soft bits (denoted as "mag'") from the region 437 through the MUX 414, performs a well-known bit flipping algorithm according to the syndromes calculated in the previous iteration (possibly in the second stage or the third stage), the variable nodes sgn' and the soft bits mag' to replace the variable nodes sgn' with variable nodes sgn" and uses one or more well-known formulae to calculate soft bits mag" according to the updated variable nodes sgn". Subsequently, the variable-node calculation circuitry 416 transmits the variable nodes sgn" and the corresponding soft bits mag" to the check-node calculation circuitry 418. The check-node calculation circuitry 418 calculates syndromes according to the obtained variable nodes sgn" and the predefined parity check matrix and transmits the variable nodes sgn", the corresponding soft bits mag" and the syndromes to the variable-node calculation circuitry 416. When the syndromes are all "0", the variable-node calculation circuitry 416 sends a decoding success message to the FSM 412, thereby enabling the FSM 412 to enter the decoding success state 551. When the syndromes are not all "0", the variable-node calculation circuitry 416 sends a decoding fail message to the FSM 412, thereby enabling the FSM 412 to maintain in the third-stage state 533 or enter the decoding fail state 553.

The FSM 412 determines whether the number of iterations executed in the third stage has exceeded the preset threshold when the FSM 412 is in the third-stage state 533 and obtains the decoding fail message from the variable-node calculation circuitry 416. If so, the FSM 412 enters the decoding fail state 553. Otherwise, the FSM 412 maintains in the third-stage state 533 and drives the variable-node calculation circuitry 416 to perform the operations for the third stage.

In the decoding success state 551, the FSM 412 obtains the user data from the codeword, stores the user data in the designated location in the RAM 136 and replies to the processing unit 134 with a decoding success message.

In the decoding fail state 553, the FSM 412 replies to the processing unit 134 with a decoding fail message, so that the processing unit 134 determines that an uncorrectable page is detected.

Figure 9:
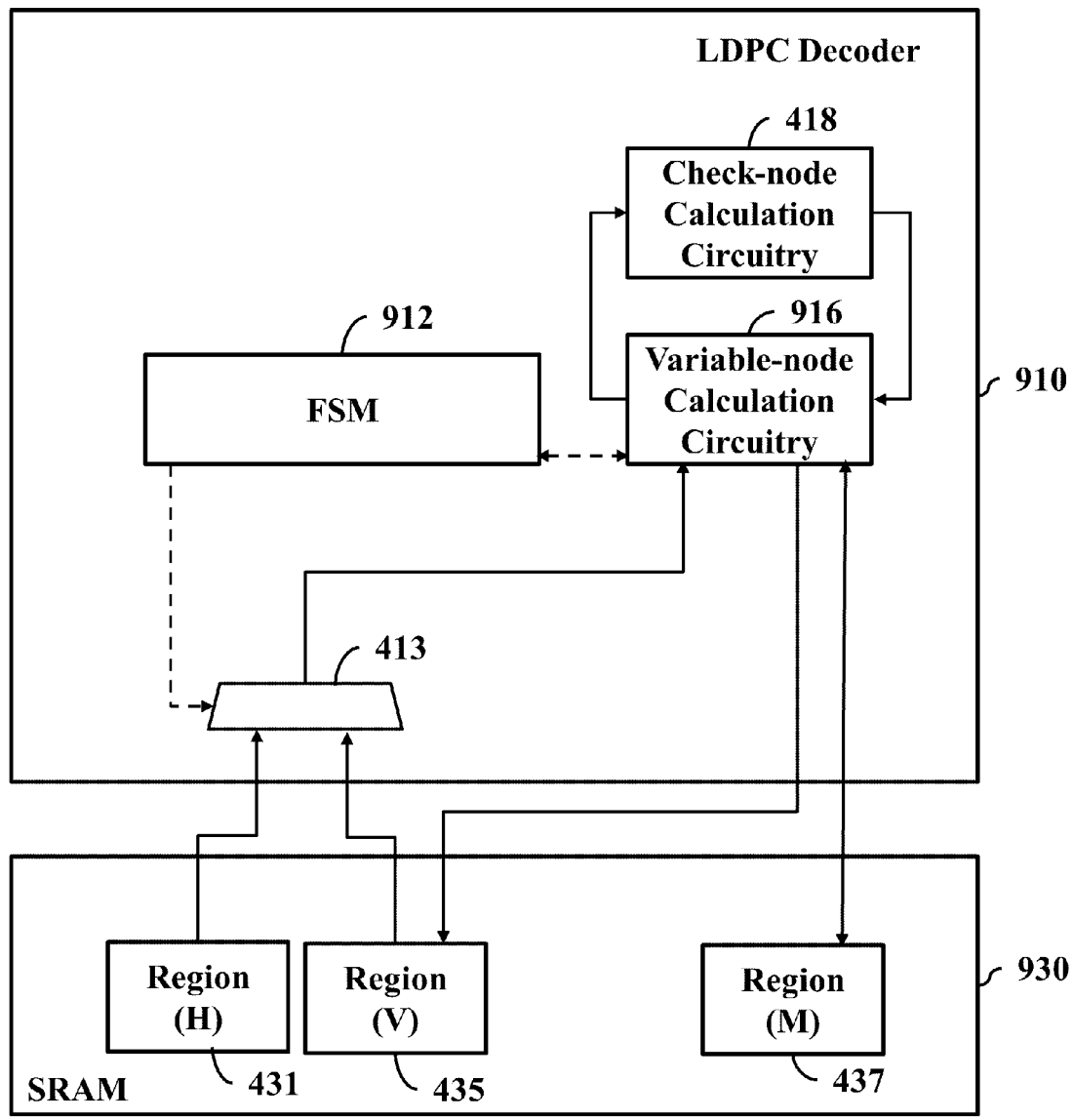
FIG. 9 is a block diagram showing an NFC according to an embodiment of the invention.

In alternative embodiments, the flash I/F 139 does not provide the soft-bit calculation circuitry. In view of this arrangement, the NFC 137 as shown in FIG. 4 is modified with the block diagram as shown in FIG. 9. Compared with the SRAM 430, the SRAM 930 as shown in FIG. 9 does not allocate the any region for storing the soft bits corresponding to the hard bits. Compared with the LDPC decoder 410, the LDPC decoder 910 as shown in FIG. 9 does not provide the MUX 414. The FSM 912 may employ the exemplary state transitions as shown in FIG. 5 to control the whole process of LDPC decoding. Among the three stages mentioned above, only the second stage make some modifications, and the remaining of the technical details are similar.

Figure 10:
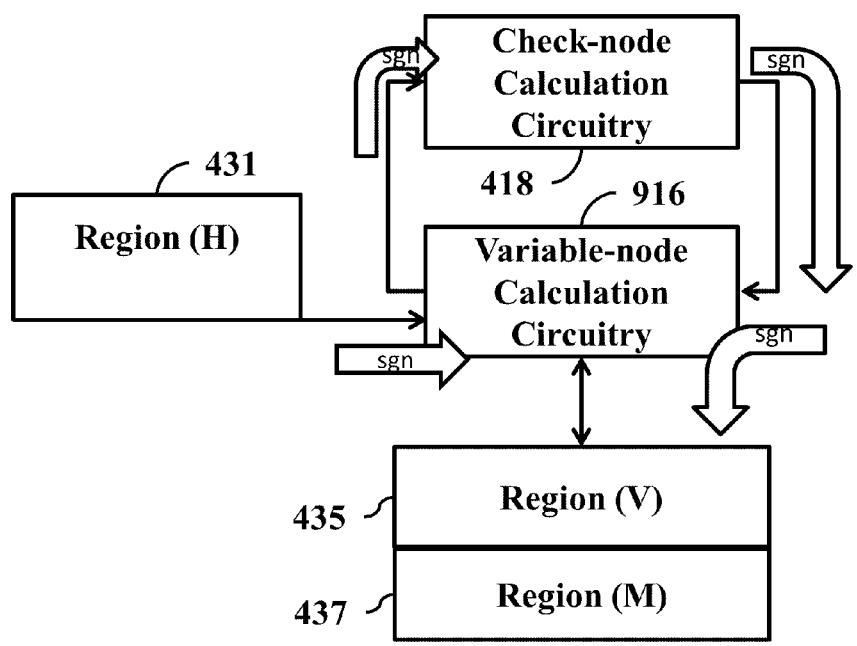
FIG. 10 is a schematic diagram showing a data flow in the first stage, which corresponds to the hardware architecture in FIG. 9, according to an embodiment of the invention.

FIG. 10 illustrates the schematic diagram for the data flow in the first stage, which is similar with FIG. 6. Therefore, the technical details of the first stage in FIG. 10 can be derived from the description related to FIG. 6, and will not be repeated for brevity.

Figure 11:
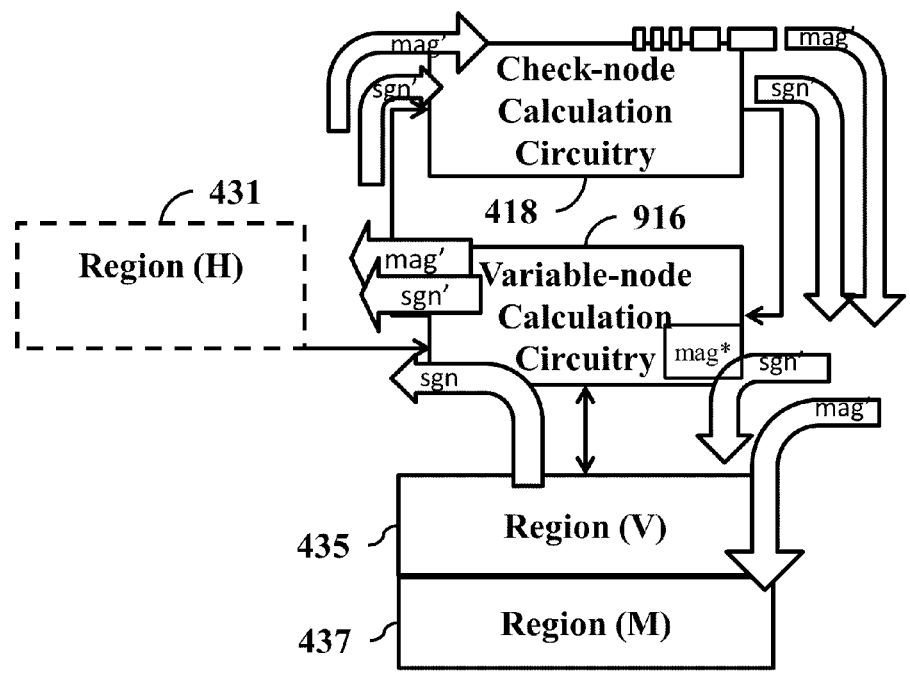
FIG. 11 is a schematic diagram showing a data flow in the second stage, which corresponds to the hardware architecture in FIG. 9, according to an embodiment of the invention.

In the second stage, the FSM 912 issues a control signal to the MUX 413 for coupling the region 435 to the variable-node calculation circuitry 916, and then, drives the variable-node calculation circuitry 916 to perform the operations for the second stage. Refer to FIG. 11 illustrating a schematic diagram of the data flow in the second stage. The variable-node calculation circuitry 416 reads the hard bits (denoted as "sgn") from the region 435 through the MUX 413, sets the soft bits as default values (denoted as "mag*", e.g. all strong, all medium or all weak), performs a well-known bit flipping algorithm to replace the hard bits sgn with variable nodes sgn' and uses one or more well-known formulae to calculate soft bits mag' according to the updated variable nodes sgn'. For subsequent technical details in the second stage, reference may be made to the corresponding description in FIG. 7, which will not be repeated for brevity.

Figure 12:
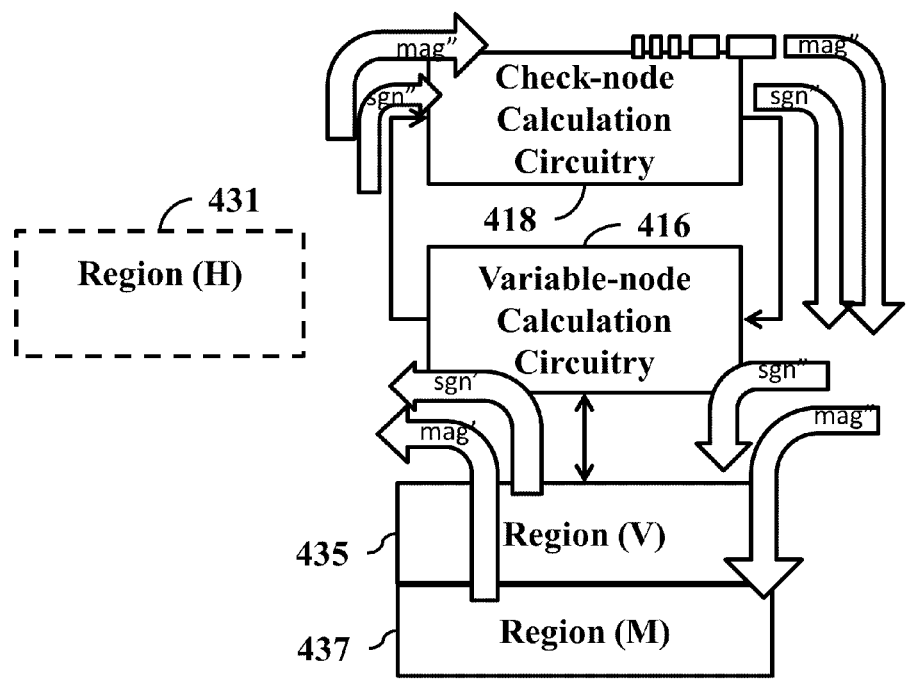
FIG. 12 is a schematic diagram showing a data flow in the third stage, which corresponds to the hardware architecture in FIG. 9, according to an embodiment of the invention.

FIG. 12 illustrates the schematic diagram for the data flow in the third stage, which is similar with FIG. 8. Therefore, the technical details of the third stage in FIG. 12 can be derived from the description related to FIG. 8, and will not be repeated for brevity.

Figure 13:
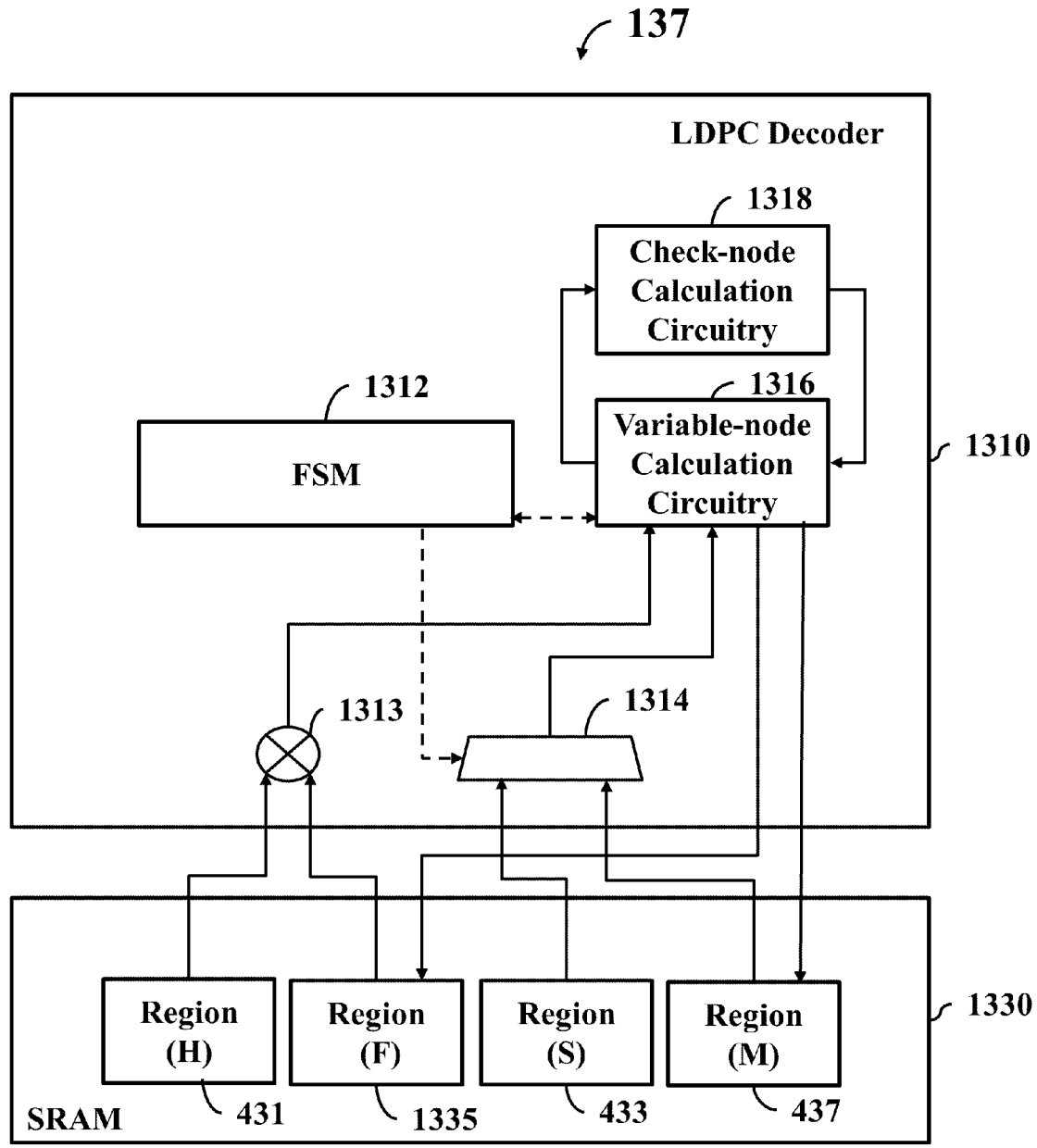
FIG. 13 is a block diagram showing an NFC according to an embodiment of the invention.

In alternative embodiments, the flash I/F 139 includes the soft-bit calculation circuitry and the LDPC decoder is a zero-based differential decoder. In view of this arrangement, the NFC 137 as shown in FIG. 4 is modified with the block diagram as shown in FIG. 13. Compared with the SRAM 430, the SRAM 1330 as shown in FIG. 13 does not allocate any region for storing the soft bits corresponding to the hard bits, but instead, the SRAM 1330 allocates the region 1335 for storing flip states. The flip states include multiple bits, and each bit stores information about whether the corresponding hard bit is flipped, for example, "0b1" represents flip (that is, change the state), "0b0" represents not flip (that is, maintain the original state). The flip states are initially all "0". The LDPC decoder 1310 includes the FSM 1312, the XOR calculator 1313, the MUX 1314, the variable-node calculation circuitry 1316 and the check-node calculation circuitry 1318. XOR calculator 1313 performs the XOR operation on the hard bits stored in the region 431 and the flip states stored in the region 1335 for generating the original hard bits or the updated variable nodes. The check-node calculation circuitry 1318 calculates the syndromes according to the calculation results outputted from the XOR calculator 1313 and the parity check matrix. Technical details of the variable-node calculation circuitry 1316 for, such as the determinations to the syndromes and the consequent operations, the performance of well-known bit-flipping algorithm and the calculation of soft bits, etc., are basically similar to that of the variable-node calculation circuitry 416, and are not repeated for brevity. Different from the variable-node calculation circuitry 416, the variable-node calculation circuitry 1316 stores the updated flip states in the region 1335 in the SRAM 1330.

The FSM 1312 employs three stages to manage the whole process of LDPC decoding. In each stage, the FSM 1312 outputs proper control signals to the MUX 1314 and the variable-node calculation circuitry 1316 for driving these components to complete the LDPC decoding together. The FSM 1312 may employ the exemplary state transitions as shown in FIG. 5 to control the whole process of LDPC decoding.

Figure 14:
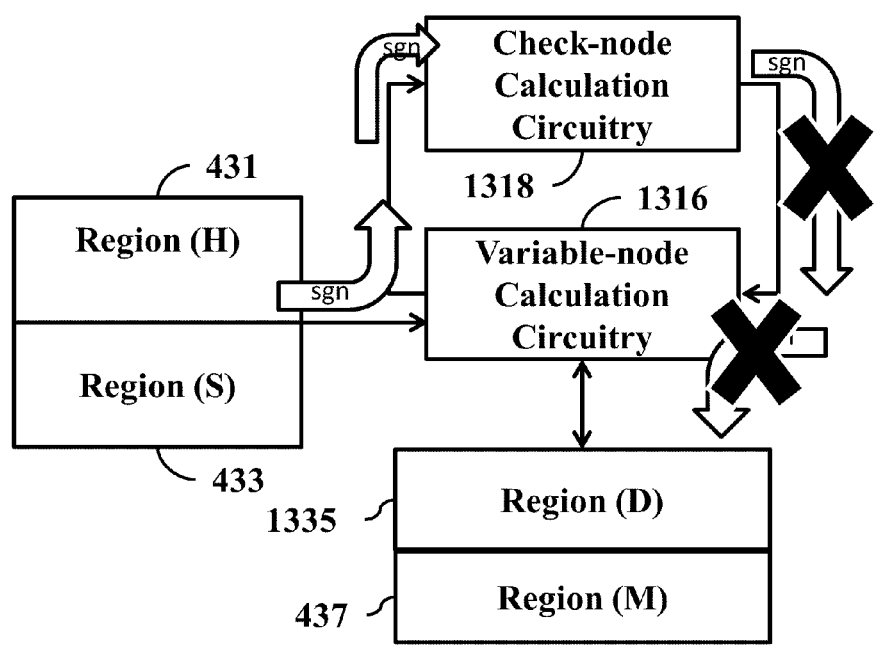
FIG. 14 is a schematic diagram showing a data flow in the first stage, which corresponds to the hardware architecture in FIG. 13, according to an embodiment of the invention.

In the first stage, the FSM 1312 drives the variable-node calculation circuitry 1316 to perform the operations for the first stage. Refer to FIG. 14 illustrating a schematic diagram of the data flow in the first stage. The variable-node calculation circuitry 1316 reads the hard bits (denoted as "sgn") through the XOR calculator 1313 and transmits the hard bits to the check-node calculation circuitry 1318. The check-node calculation circuitry 1318 calculates syndromes according to the obtained hard bits and the predefined parity check matrix and transmits the syndromes to the variable-node calculation circuitry 1316. It is noted that the check-node calculation circuitry 1318 does not transmit the hard bits to the variable-node calculation circuitry 1316. When the syndromes are all "0", the variable-node calculation circuitry 1316 sends a decoding success message to the FSM 1312, thereby enabling the FSM 1312 to enter the decoding success state 551. When the syndromes are not all "0", the variable-node calculation circuitry 1316 stores the hard bits in the region 1335 and sends a decoding fail message to the FSM 1312, thereby enabling the FSM 1312 to enter the second-stage state 532. It is noted that, the region 431 cannot be released because the hard bits are always used.

Figure 15:
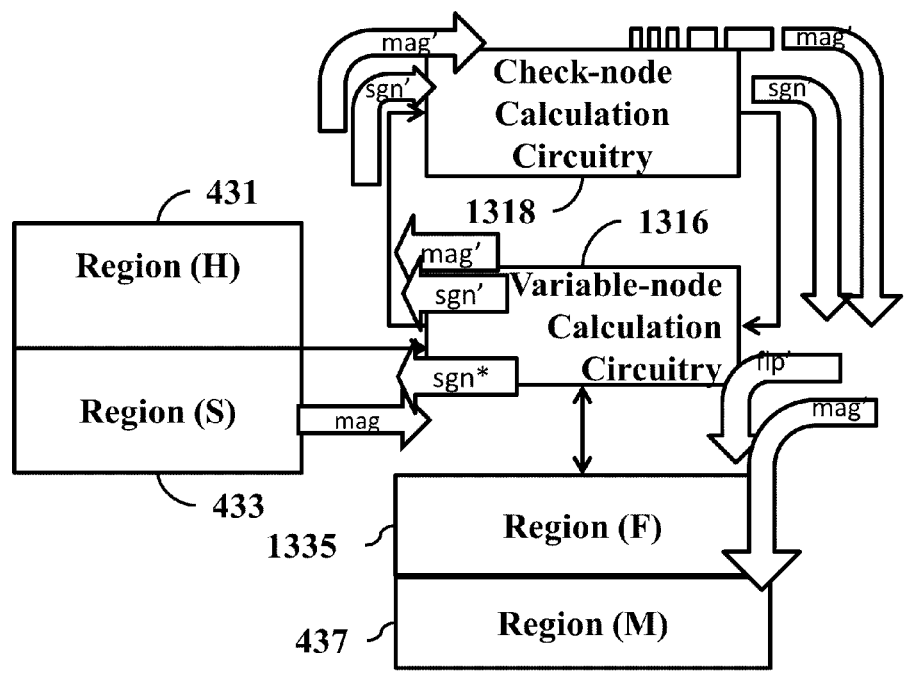
FIG. 15 is a schematic diagram showing a data flow in the second stage, which corresponds to the hardware architecture in FIG. 13, according to an embodiment of the invention.

Refer to FIG. 15 showing a schematic diagram of the data flow in the second stage. In the second stage, the FSM 1312 issues a control signal to the MUX 1314 for coupling the region 433 to the variable-node calculation circuitry 1316, and then, drives the variable-node calculation circuitry 1316 to perform the operations for the second stage. Refer to FIG. 13 illustrating a schematic diagram of the data flow in the second stage. The variable-node calculation circuitry 1316 reads the soft bits (denoted as "mag") from the region 433 through the MUX 1314, performs a well-known bit flipping algorithm according to the syndromes calculated in the first stage, the default hard bits (preset to all "0", denoted as "sgn*", i.e., replace the actual hard bits stored in the region 431 with default values) and the soft bits mag to replace the hard bits sgn with variable nodes sgn' (which includes an error pattern) and uses one or more well-known formulae to calculate corresponding soft bits mag' according to the updated variable nodes sgn'. Subsequently, the variable-node calculation circuitry 1316 transmits the variable nodes sgn' and the corresponding soft bits mag' to the check-node calculation circuitry 1318. The check-node calculation circuitry 1318 calculates syndromes according to the obtained variable nodes sgn' and the predefined parity check matrix and transmits the variable nodes sgn', the corresponding soft bits mag' and the syndromes to the variable-node calculation circuitry 1316. Since the variable nodes sgn' includes the error pattern, the variable-node calculation circuitry 1316 obtains the syndromes (which are not all "0"), stores the flip states flp' in the region 1335, stores the corresponding soft bits mag' in the region 437 and sends a decoding fail message to the FSM 1312, thereby enabling the FSM 1312 to enter the third-stage state 533. Since the initial soft bits has been stored in the region 437, the region 433 is no longer to be used for the current codeword in process. The region 433 is released to store soft bits for the next codeword by the flash I/F 139.

Figure 16:
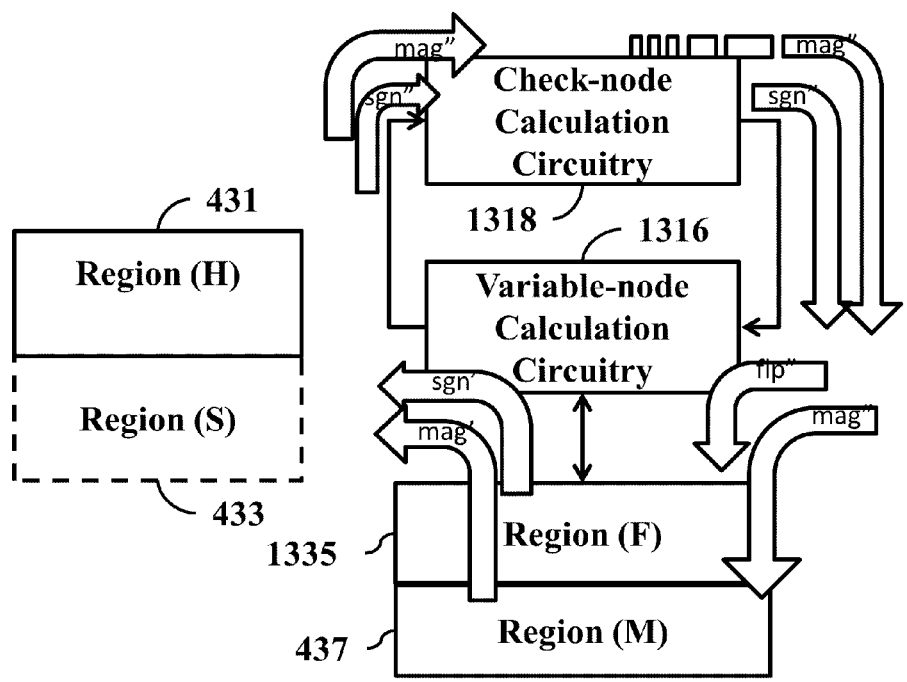
FIG. 16 is a schematic diagram showing a data flow in the third stage, which corresponds to the hardware architecture in FIG. 13, according to an embodiment of the invention.

The third stage may include the second and subsequent decoding iterations. This stage is repeatedly entered until the decoding is successful, or the decoding fails after the preset number of iterations. At the beginning of entering the third stage, the FSM 1312 issues a control signal to the MUX 1314 for coupling the region 437 to the variable-node calculation circuitry 1316, and then, drives the variable-node calculation circuitry 1316 to perform the operations for the third stage. Refer to FIG. 16 illustrating a schematic diagram of the data flow in the third stage. The variable-node calculation circuitry 1316 reads the variable nodes (denoted as "sgn'") from the XOR calculator 1313, reads the corresponding soft bits (denoted as "mag'") from the region 437 through the MUX 1314, performs a well-known bit flipping algorithm according to the syndromes calculated in the previous iteration (possibly in the second stage or the third stage), the variable nodes sgn' and the soft bits mag' to replace the variable nodes sgn' with variable nodes sgn", calculates the difference between the hard bits sgn and the variable nodes sgn" to generate new flip states (denoted as "flp'") and uses one or more well-known formulae to calculate soft bits mag" according to the updated variable nodes sgn". Subsequently, the variable-node calculation circuitry 1316 transmits the variable nodes sgn" and the corresponding soft bits mag" to the check-node calculation circuitry 1318. The check-node calculation circuitry 1318 calculates syndromes according to the obtained variable nodes sgn" and the predefined parity check matrix and transmits the variable nodes sgn", the corresponding soft bits mag" and the syndromes to the variable-node calculation circuitry 1316. When the syndromes are all "0", the variable-node calculation circuitry 1316 sends a decoding success message to the FSM 1312, thereby enabling the FSM 1312 to enter the decoding success state 551. When the syndromes are not all "0", the variable-node calculation circuitry 1316 sends a decoding fail message to the FSM 1312, thereby enabling the FSM 1312 to maintain in the third-stage state 533 or enter the decoding fail state 553.

Although the embodiment has been described as having specific elements in FIGS. 1, 2, 4, 9, and 13, it should be noted that additional elements may be included to achieve better performance without departing from the spirit of the invention. Each element of FIGS. 1, 2, 4, 9, and 13 is composed of various circuitries and arranged operably to perform the aforementioned operations.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for decoding a Low-Density Parity-Check (LDPC) code, performed by an LDPC decoder comprising a variable-node calculation circuitry and a check-node calculation circuitry, the method comprising:
   entering, by the LDPC decoder, a first-stage state when detecting a codeword has been stored in a static random access memory (SRAM), wherein the check-node calculation circuitry is arranged operably to perform a modulo 2 multiplication on the codeword and a parity check matrix to calculate a plurality of first syndromes in the first-stage state, and the codeword comprises user data and the LDPC code;
   entering, by the LDPC decoder, a second-stage state when the first syndromes indicate that the codeword obtained in the first-stage state is incorrect, wherein the variable-node calculation circuitry is arranged operably to perform a bit flipping algorithm according to the codeword, a plurality of first soft bits corresponding to the codeword, and the first syndromes to generate a plurality of variable nodes, and calculate a plurality of second soft bits for the variable nodes in the second-stage state, the check-node calculation circuitry is arranged operably to perform the modulo 2 multiplication on the variable nodes and the parity check matrix to calculate a plurality of second syndromes in the second-stage stage, each hard bit in the codeword is associated with at least one first soft bit to indicate a first likelihood of belief for this hard bit, and each variable node is associated with at least one second soft bit to indicate a second likelihood of belief for this variable; and
   repeatedly entering, by the LDPC decoder, a third-stage state when the second syndromes indicate that the variable nodes generated in the second-stage state are incorrect until a decoding succeeds or a total number of iterations of the third-stage state exceeds a threshold, wherein the variable-node calculation circuitry is arranged operably to perform the bit flipping algorithm according to the variable nodes, the second soft bits corresponding to the variable nodes, and the second syndromes to generate a plurality of new variable nodes, and calculate a plurality of new second soft bits for the new variable nodes in each iteration of the third-stage state, and the check-node calculation circuitry is arranged operably to perform the modulo 2 multiplication on the new variable nodes and the parity check matrix to calculate a plurality of new second syndromes in each iteration of the third-stage stage.

2. The method of claim 1, wherein the LDPC decoder comprises a finite-state machine (FSM), the method comprising:
   directing, by the FSM, the LDPC decoder to enter the first-stage state in response that the codeword has been stored in the SRAM;
   directing, by the FSM, the LDPC decoder to enter the second-stage state in response that the first syndromes indicate that the codeword obtained in the first-stage state is incorrect;
   directing, by the FSM, the LDPC decoder to enter the third-stage state in response that the second syndromes indicate the variable nodes generated in the second-stage state or a previous iteration of the third-stage state are incorrect; and
   limiting, by the FSM, the total number of iterations of the third-stage state that the LDPC decoder enters not to exceed the threshold.

3. The method of claim 1, wherein the codeword is read from a flash module through a flash interface (I/F) to store in the SRAM.

4. The method of claim 1, wherein the LDPC decoder comprises a finite-state machine (FSM), a first multiplexer (MUX) and a second MUX, an output terminal of the first MUX is coupled to the variable-node calculation circuitry and two input terminals of the first MUX are coupled to a first region and a second region of the SRAM, respectively, an output terminal of the second MUX is coupled to the variable-node calculation circuitry, two input terminals of the second MUX are coupled to a third region and a fourth region of the SRAM, respectively, the codeword is read from a flash module through a flash interface (I/F) and is stored in the first region of the SRAM, the flash I/F is arranged operably to generate the first soft bits corresponding to the codeword, and the first soft bits are stored in the third region of the SRAM, the method comprising:
   issuing, by the FSM in the first-stage state, a first control signal to the first MUX to couple the first region of the SRAM to the variable-node calculation circuitry and driving the variable-node calculation circuitry to perform operations for a first stage, whereby enabling the variable-node calculation circuitry operably to read the codeword from the first region of the SRAM through the first MUX, transmit the codeword to the check-node calculation circuitry, obtain the first syndromes from the check-node calculation circuitry, transmit a decoding success message or a decoding fail message to the FSM according to the first syndromes and store the codeword in the second region of the SRAM;
   issuing, by the FSM in the second-stage state, a second control signal to the second MUX to couple the third region of the SRAM to the variable-node calculation circuitry and driving the variable-node calculation circuitry to perform operations for a second stage, whereby enabling the variable-node calculation circuitry operably to read the first soft bits from the third region of the SRAM through the second MUX, transmit the variable nodes to the check-node calculation circuitry, obtain the second syndromes from the check-node calculation circuitry, transmit the decoding success message or the decoding fail message to the FSM according to the second syndromes, store the variable nodes in the second region of the SRAM and store the second soft bits in the fourth region of the SRAM; and issuing, by the FSM in each iteration of the third-stage state, a third control signal to the first MUX to couple the second region of the SRAM to the variable-node calculation circuitry, issuing a fourth control signal to the second MUX to couple the fourth region of the SRAM to the variable-node calculation circuitry and driving the variable-node calculation circuitry to perform operations for a third stage, whereby enabling the variable-node calculation circuitry operably to read the variable nodes from the second region of the SRAM through the first MUX, read the second soft bits corresponding to the variable nodes from the fourth region of the SRAM through the second MUX, transmit the new variable nodes to the check-node calculation circuitry, obtain the new second syndromes from the check-node calculation circuitry, transmit the decoding success message or the decoding fail message to the FSM according to the new second syndromes, store the new variable nodes in the second region of the SRAM and store the new second soft bits in the fourth region of the SRAM.

5. The method of claim 4, comprising:
releasing the first region of the SRAM after the codeword is stored in the second region of the SRAM; and
releasing the third region of the SRAM after the second soft bits are stored in the fourth region of the SRAM.

6. The method of claim 1, wherein the LDPC decoder comprises a finite-state machine (FSM) and a multiplexer (MUX), an output terminal of the MUX is coupled to the variable-node calculation circuitry and two input terminals of the MUX are coupled to a first region and a second region of the SRAM, respectively, and the codeword is read from a flash module through a flash interface (I/F) and is stored in the first region of the SRAM, the method comprising:

issuing, by the FSM in the first-stage state, a first control signal to the MUX to couple the first region of the SRAM to the variable-node calculation circuitry and driving the variable-node calculation circuitry to perform operations for a first stage, whereby enabling the variable-node calculation circuitry operably to read the codeword from the first region of the SRAM through the MUX, transmit the codeword to the check-node calculation circuitry, obtain the first syndromes from the check-node calculation circuitry, transmit a decoding success message or a decoding fail message to the FSM according to the first syndromes and store the codeword in the second region of the SRAM;

driving, by the FSM in the second-stage state, the variable-node calculation circuitry to perform operations for a second stage, whereby enabling the variable-node calculation circuitry operably to treat default values as the first soft bits, transmit the variable nodes to the check-node calculation circuitry, obtain the second syndromes from the check-node calculation circuitry, transmit a decoding success message or a decoding fail message to the FSM according to the second syndromes, store the variable nodes in the second region of the SRAM and store the second soft bits in a third region of the SRAM; and issuing, by the FSM in each iteration of the third-stage state, a second control signal to the MUX to couple the second region of the SRAM to the variable-node calculation circuitry and driving the variable-node calculation circuitry to perform operations for a third stage, whereby enabling the variable-node calculation circuitry operably to read the variable nodes from the second region of the SRAM through the MUX, read the second soft bits corresponding to the variable nodes from the third region of the SRAM, transmit the new variable nodes to the check-node calculation circuitry, obtain the new second syndromes from the check-node calculation circuitry, transmit a decoding success message or a decoding fail message to the FSM according to the new second syndromes, store the new variable nodes in the second region of the SRAM and store the new second soft bits in the third region of the SRAM.

7. The method of claim 6, comprising:
releasing the first region of the SRAM after the codeword is stored in the second region of the SRAM.

8. The method of claim 1, wherein the LDPC decoder comprises a finite-state machine (FSM), an exclusive-OR (XOR) calculator and a multiplexer (MUX), an output terminal of the MUX is coupled to the variable-node calculation circuitry and two input terminals of the MUX are coupled to a third region and a fourth region of the SRAM, respectively, and the codeword is read from a flash module through a flash interface (I/F) and is stored in a first region of the SRAM, a second region of the SRAM stores flip states being initially all "0", the flash I/F is arranged operably to generate the first soft bits corresponding to the codeword, the first soft bits are stored in the third region of the SRAM, the XOR calculator is arranged operably to perform an XOR operation on the codeword in the first region of the SRAM and the flip states in the second region of SRAM and output a calculation result to the variable-node calculation circuitry, the method comprising:

driving, by the FSM in the first-stage state, the variable-node calculation circuitry to perform operations for a first stage, whereby enabling the variable-node calculation circuitry operably to obtain the codeword from the XOR calculator, transmit the codeword to the check-node calculation circuitry, obtain the first syndromes from the check-node calculation circuitry and transmit a decoding success message or a decoding fail message to the FSM according to the first syndromes;

issuing, by the FSM in the second-stage state, a first control signal to the MUX to couple the third region of the SRAM to the variable-node calculation circuitry and driving the variable-node calculation circuitry to perform operations for a second stage, whereby enabling the variable-node calculation circuitry operably to treat the codeword as all "0", read the first soft bits from the third region of the SRAM through the MUX, calculate differences between the codeword and the variable nodes to generate the flip states, transmit the variable nodes to the check-node calculation circuitry, obtain the second syndromes from the check-node calculation circuitry, transmit the decoding success message or the decoding fail message to the FSM according to the second syndromes, store the flip states in the second region of the SRAM and store the second soft bits in the fourth region of the SRAM;

issuing, by the FSM in each iteration of the third-stage state, a second control signal to the MUX to couple the fourth region of the SRAM to the variable-node calculation circuitry and driving the variable-node calculation circuitry to perform operations for a third stage, whereby enabling the variable-node calculation circuitry operably to obtain the variable nodes from XOR calculator, read the second soft bits corresponding to the variable nodes from the fourth region of the SRAM, calculate differences between the codeword and the new variable nodes to generate new flip states, transmit the new variable nodes to the check-node calculation circuitry, obtain the new second syndromes from the check-node calculation circuitry, transmit the decoding success message or the decoding fail message to the FSM according to the new second syndromes, store the new flip states in the second region of the SRAM and store the new second soft bits in the fourth region of the SRAM.

9. The method of claim 8, comprising:
releasing the third region of the SRAM after the second soft bits are stored in the fourth region of the SRAM.

10. An apparatus for decoding a Low-Density Parity-Check (LDPC) code, comprising:
a variable-node calculation circuitry, coupled to a static random access memory (SRAM); and
a check-node calculation circuitry, coupled to the variable-node calculation circuitry,
wherein the apparatus enters a first-stage state when detecting a codeword has been stored in the SRAM, the check-node calculation circuitry is arranged operably to perform a modulo 2 multiplication on the codeword and a parity check matrix to calculate a plurality of first syndromes in the first-stage state, and the codeword comprises user data and the LDPC code;
wherein the apparatus enters a second-stage state when the first syndromes indicate that the codeword obtained in the first-stage state is incorrect, the variable-node calculation circuitry is arranged operably to perform a bit flipping algorithm according to the codeword, a plurality of first soft bits corresponding to the codeword, and the first syndromes to generate a plurality of variable nodes, and calculate a plurality of second soft bits for the variable nodes in the second-stage state, the check-node calculation circuitry is arranged operably to perform the modulo 2 multiplication on the variable nodes and the parity check matrix to calculate a plurality of second syndromes in the second-stage stage, each hard bit in the codeword is associated with at least one first soft bit to indicate a first likelihood of belief for this hard bit, and each variable node is associated with at least one second soft bit to indicate a second likelihood of belief for this variable; and
wherein the apparatus repeatedly enters a third-stage state when the second syndromes indicate that the variable nodes generated in the second-stage state are incorrect until a decoding succeeds or a total number of iterations of the third-stage state exceeds a threshold, the variable-node calculation circuitry is arranged operably to perform the bit flipping algorithm according to the variable nodes, the second soft bits corresponding to the variable nodes, and the second syndromes to generate a plurality of new variable nodes, and calculate a plurality of new second soft bits for the new variable nodes in each iteration of the third-stage state, and the check-node calculation circuitry is arranged operably to perform the modulo 2 multiplication on the new variable nodes and the parity check matrix to calculate a plurality of new second syndromes in each iteration of the third-stage stage.

11. The apparatus of claim 10, comprising:
a finite-state machine (FSM), arranged operably to: direct the apparatus to enter the first-stage state in response that the codeword has been stored in the SRAM; direct the apparatus to enter the second-stage state in response that the first syndromes indicate that the codeword obtained in the first-stage state is incorrect; direct the apparatus to enter the third-stage state in response that the second syndromes indicate the variable nodes generated in the second-stage state or a previous iteration of the third-stage state are incorrect; and limit the total number of iterations of the third-stage state that the apparatus enters not to exceed the threshold.

12. The apparatus of claim 10, comprising:
a finite-state machine (FSM);
a first multiplexer (MUX), comprising a first output terminal coupled to the variable-node calculation circuitry, and two first input terminals coupled to a first region and a second region of the SRAM, respectively;
a second MUX, comprising a second output terminal coupled to the variable-node calculation circuitry, and two second input terminals coupled to a third region and a fourth region of the SRAM, respectively;
wherein the codeword is read from a flash module through a flash interface (I/F) and is stored in the first region of the SRAM,
wherein the flash I/F is arranged operably to generate the first soft bits corresponding to the codeword, and the first soft bits are stored in the third region of the SRAM,
wherein the FSM in the first-stage state is arranged operably to issue a first control signal to the first MUX to couple the first region of the SRAM to the variable-node calculation circuitry and drive the variable-node calculation circuitry to perform operations for a first stage, whereby enabling the variable-node calculation circuitry operably to read the codeword from the first region of the SRAM through the first MUX, transmit the codeword to the check-node calculation circuitry, obtain the first syndromes from the check-node calculation circuitry, transmit a decoding success message or a decoding fail message to the FSM according to the first syndromes and store the codeword in the second region of the SRAM,
wherein the FSM in the second-stage state is arranged operably to issue a second control signal to the second MUX to couple the third region of the SRAM to the variable-node calculation circuitry and drive the variable-node calculation circuitry to perform operations for a second stage, whereby enabling the variable-node calculation circuitry operably to read the first soft bits from the third region of the SRAM through the second MUX, transmit the variable nodes to the check-node calculation circuitry, obtain the second syndromes from the check-node calculation circuitry, transmit the decoding success message or the decoding fail message to the FSM according to the second syndromes, store the variable nodes in the second region of the SRAM and store the second soft bits in the fourth region of the SRAM,
wherein the FSM in each iteration of the third-stage state is arranged operably to issue a third control signal to the first MUX to couple the second region of the SRAM to the variable-node calculation circuitry, issue a fourth control signal to the second MUX to couple the fourth region of the SRAM to the variable-node calculation circuitry and drive the variable-node calculation circuitry to perform operations for a third stage, whereby enabling the variable-node calculation circuitry operably to read the variable nodes from the second region of the SRAM through the first MUX, read the second soft bits corresponding to the variable nodes from the fourth region of the SRAM through the second MUX, transmit the new variable nodes to the check-node calculation circuitry, obtain the new second syndromes from the check-node calculation circuitry, transmit the decoding success message or the decoding fail message to the FSM according to the new second syndromes, store the new variable nodes in the second region of the SRAM and store the new second soft bits in the fourth region of the SRAM.

13. The apparatus of claim 12, wherein the first region of the SRAM is released after the codeword is stored in the second region of the SRAM and the third region of the SRAM is released after the second soft bits are stored in the fourth region of the SRAM.

14. The apparatus of claim 12, wherein the variable-node calculation circuitry is arranged operably to transmit the decoding success message to the FSM when the first syndromes, the second syndromes or the new second syndromes are all "0" and transmit the decoding fail message to the FSM when the first syndromes, the second syndromes or the new second syndromes are not all "0".

15. The apparatus of claim 10, comprising:
a finite-state machine (FSM); and
a multiplexer (MUX), comprising an output terminal coupled to the variable-node calculation circuitry, and two input terminals coupled to a first region and a second region of the SRAM, respectively,
wherein the codeword is read from a flash module through a flash interface (I/F) and is stored in the first region of the SRAM,
wherein the FSM in the first-stage state is arranged operably to issue a first control signal to the MUX to couple the first region of the SRAM to the variable-node calculation circuitry and drive the variable-node calculation circuitry to perform operations for a first stage, whereby enabling the variable-node calculation circuitry operably to read the codeword from the first region of the SRAM through the MUX, transmit the codeword to the check-node calculation circuitry, obtain the first syndromes from the check-node calculation circuitry, transmit a decoding success message or a decoding fail message to the FSM according to the first syndromes and store the codeword in the second region of the SRAM,
wherein the FSM in the second-stage state is arranged operably to drive the variable-node calculation circuitry to perform operations for a second stage, whereby enabling the variable-node calculation circuitry operably to treat default values as the first soft bits, transmit the variable nodes to the check-node calculation circuitry, obtain the second syndromes from the check-node calculation circuitry, transmit the decoding success message or the decoding fail message to the FSM according to the second syndromes, store the variable nodes in the second region of the SRAM and store the second soft bits in a third region of the SRAM,
wherein the FSM in each iteration of the third-stage state is arranged operably to issue a second control signal to the MUX to couple the second region of the SRAM to the variable-node calculation circuitry and drive the variable-node calculation circuitry to perform operations for a third stage, whereby enabling the variable-node calculation circuitry operably to read the variable nodes from the second region of the SRAM through the MUX, read the second soft bits corresponding to the variable nodes from the third region of the SRAM, transmit the new variable nodes to the check-node calculation circuitry, obtain the new second syndromes from the check-node calculation circuitry, transmit the decoding success message or the decoding fail message to the FSM according to the new second syndromes, store the new variable nodes in the second region of the SRAM and store the new second soft bits in the third region of the SRAM.

16. The apparatus of claim 15, wherein the first region of the SRAM is released after the codeword is stored in the second region of the SRAM.

17. The apparatus of claim 15, wherein the variable-node calculation circuitry is arranged operably to transmit the decoding success message to the FSM when the first syndromes, the second syndromes or the new second syndromes are all "0" and transmit the decoding fail message to the FSM when the first syndromes, the second syndromes or the new second syndromes are not all "0".

18. The apparatus of claim 10, comprising:
a finite-state machine (FSM);
an exclusive-OR (XOR) calculator; and
a multiplexer (MUX) comprising an output terminal coupled to the variable-node calculation circuitry, and two input terminals coupled to a third region and a fourth region of the SRAM, respectively,
wherein the codeword is read from a flash module through a flash interface (I/F) and is stored in a first region of the SRAM,
wherein a second region of the SRAM stores flip states being initially all "0",
wherein the flash I/F is arranged operably to generate the first soft bits corresponding to the codeword, the first soft bits are stored in the third region of the SRAM,
wherein the XOR calculator is arranged operably to perform an XOR operation on the codeword in the first region of the SRAM and the flip states in the second region of SRAM and output a calculation result to the variable-node calculation circuitry,
wherein the FSM in the first-stage state is arranged operably to drive the variable-node calculation circuitry to perform operations for a first stage, whereby enabling the variable-node calculation circuitry operably to obtain the codeword from the XOR calculator, transmit the codeword to the check-node calculation circuitry, obtain the first syndromes from the check-node calculation circuitry and transmit a decoding success message or a decoding fail message to the FSM according to the first syndromes,
wherein the FSM in the second-stage state is arranged operably to issue a first control signal to the MUX to couple the third region of the SRAM to the variable-node calculation circuitry and drive the variable-node calculation circuitry to perform operations for a second stage, whereby enabling the variable-node calculation circuitry operably to treat the codeword as all "0", read the first soft bits from the third region of the SRAM through the MUX, calculate differences between the codeword and the variable nodes to generate the flip states, transmit the variable nodes to the check-node calculation circuitry, obtain the second syndromes from the check-node calculation circuitry, transmit the decoding success message or the decoding fail message to the FSM according to the second syndromes, store the flip states in the second region of the SRAM and store the second soft bits in the fourth region of the SRAM, wherein the FSM in each iteration of the third-stage state is arranged operably to issue a second control signal to the MUX to couple the fourth region of the SRAM to the variable-node calculation circuitry and drive the variable-node calculation circuitry to perform operations for a third stage, whereby enabling the variable-node calculation circuitry operably to obtain the variable nodes from XOR calculator, read the second soft bits corresponding to the variable nodes from the fourth region of the SRAM, calculate differences between the codeword and the new variable nodes to generate new flip states, transmit the new variable nodes to the check-node calculation circuitry, obtain the new second syndromes from the check-node calculation circuitry, transmit the decoding success message or the decoding fail message to the FSM according to the new second syndromes, store the new flip states in the second region of the SRAM and store the new second soft bits in the fourth region of the SRAM.

19. The apparatus of claim 18, wherein the third region of the SRAM is released after the second soft bits are stored in the fourth region of the SRAM.

20. The apparatus of claim 18, wherein the variable-node calculation circuitry is arranged operably to transmit the decoding success message to the FSM when the first syndromes, the second syndromes or the new second syndromes are all "0" and transmit the decoding fail message to the FSM when the first syndromes, the second syndromes or the new second syndromes are not all "0".

* * * * *